(12) United States Patent
Oka et al.

(10) Patent No.: US 8,569,184 B2
(45) Date of Patent: Oct. 29, 2013

(54) METHOD FOR FORMING SINGLE-PHASE MULTI-ELEMENT FILM BY PEALD

(75) Inventors: Takahiro Oka, Sagamihara (JP); Akira Shimizu, Sagamihara (JP)

(73) Assignee: ASM Japan K.K., Tokyo (JP)

( * ) Notice: Subject to any disclaimer, the term of this patent is extended or adjusted under 35 U.S.C. 154(b) by 147 days.

(21) Appl. No.: 13/250,721

(22) Filed: Sep. 30, 2011

(65) Prior Publication Data
US 2013/0084714 A1  Apr. 4, 2013

(51) Int. Cl.
*H01L 21/31* (2006.01)

(52) U.S. Cl.
USPC .......................................... 438/765; 438/792

(58) Field of Classification Search
USPC ....................................................... 438/765
See application file for complete search history.

(56) References Cited

U.S. PATENT DOCUMENTS

| | | | |
|---|---|---|---|
| 6,730,614 B1 * | 5/2004 | Lim et al. ...................... | 438/763 |
| 2005/0064207 A1 | 3/2005 | Senzaki | |
| 2007/0251444 A1* | 11/2007 | Gros-Jean et al. .............. | 117/92 |
| 2009/0209081 A1 | 8/2009 | Matero | |
| 2010/0124618 A1 | 5/2010 | Kobayashi | |
| 2010/0124621 A1 | 5/2010 | Kobayashi | |
| 2010/0255218 A1 | 10/2010 | Oka | |
| 2011/0014795 A1 | 1/2011 | Lee | |
| 2011/0086516 A1 | 4/2011 | Lee | |
| 2011/0108929 A1 | 5/2011 | Meng | |

FOREIGN PATENT DOCUMENTS

JP    2010245518 A   * 10/2010

* cited by examiner

*Primary Examiner* — Ajay K Arora
(74) *Attorney, Agent, or Firm* — Snell & Wilmer L.L.P.

(57) ABSTRACT

A method for forming a single-phase multi-element film on a substrate in a reaction zone by PEALD repeating a single deposition cycle. The single deposition cycle includes: adsorbing a precursor on the substrate in the absence of reactant and plasma; decomposing the precursor adsorbed on the substrate by an inert gas plasma; and reacting the decomposed precursor with a reactant gas plasma in the presence of the inert gas plasma. The multi-element film contains silicon and at least two non-metal elements constituting a matrix of the film, the precursor contains silicon and optionally at least one non-metal element to be incorporated in the matrix, and the reactant gas contains at least one non-metal element to be incorporated in the matrix.

20 Claims, 4 Drawing Sheets

METHOD FOR FORMING SINGLE-PHASE MULTI-ELEMENT FILM BY PEALD

BACKGROUND OF THE INVENTION

1. Field of the Invention

The present invention generally relates to plasma enhanced atomic layer deposition (PEALD), particularly to a method for forming a single-phase multi-element film by PEALD.

2. Description of the Related Art

A Si-based mono-element insulation film (i.e., a film containing Si as the metal element and another non-metal element bonded to each other) expressed as SiX (X=B, C, N, or O) such as SiO or SiN is deposited by atomic layer deposition (ALD) using, as a reactant, O2 or O3 for SiO and NH3 for SiN. The "mono-element" refers to a single non-metal element in addition to a metal element. Although depending on the type of reactant, a base substrate or a photoresist is vulnerable to deformation due to plasma damage caused when the mono-element Si-based insulation film is exposed to a plasma, and the etch selectivity of the mono-element Si-based insulation film is insufficient. From the above viewpoints, multi-element Si-based films are under development. The term "multi-element" refers to multiple non-metal elements in addition to a metal element. As a method of depositing a multi-element insulation Si-based film, an ALD laminate method is known such as those disclosed in US 2009/0209081 A1, wherein for a SiOC film, for example, a SiC sub-layer and a SiO sub-layer are alternately deposited repeatedly by ALD, thereby forming a laminate film of SiOC. Since the above method uses two different types of cycle (i.e., a cycle for a SiC sub-layer, and another cycle for a SiO sub-layer), more steps and more complicated operation are required as compared with a method using a single type of cycle.

One object according to an embodiment of the present invention is to provide a method for depositing a multi-element Si-based insulation film by ALD without laminating different sub-layers.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

Some embodiments provide a method for forming a single-phase multi-element film on a substrate in a reaction zone by plasma enhanced atomic layer deposition (PEALD) repeating a single deposition cycle, said single deposition cycle comprising: (i) adsorbing a precursor on the substrate in the absence of reactant and plasma; (ii) decomposing the precursor adsorbed on the substrate by an inert gas plasma; and (iii) reacting the decomposed precursor with a reactant gas plasma in the presence of the inert gas plasma, wherein the multi-element film contains silicon and at least two non-metal elements constituting a matrix of the film, the precursor contains silicon and optionally at least one non-metal element to be incorporated in the matrix, and the reactant gas contains at least one non-metal element to be incorporated in the matrix.

In some embodiments, the step of decomposing the precursor and the step of reacting the decomposed precursor are conducted continuously in sequence. In this disclosure, the term "continuously" refers to without interruption as a timeline, immediately thereafter, or as a next step. In some embodiments, the duration of the step of reacting the decomposed precursor is less than 50% (including 30%, 20%, or 10% or less, but more than 0%) of the total duration of the step of decomposing the precursor and the step of reacting the decomposed precursor. In some embodiments, the total duration of the step of decomposing the precursor and the step of reacting the decomposed precursor is about 0.6 seconds to about 2.5 seconds (including about 0.8 seconds to about 1.5 seconds). In some embodiments, the step of reacting the decomposed precursor comprises supplying a reactant gas at a flow rate of about 50 sccm or less (including about 40 sccm, about 30 sccm, about 20 sccm, about 10 sccm or less but at least about 5 sccm) to the reaction zone while applying RF power to the reaction zone.

In some embodiments, an inert gas is supplied continuously throughout the single deposition cycle, serves as a purge gas between the step of adsorbing the precursor and the step of decomposing the precursor, and after the step of reacting the decomposed precursor, and is used for generating the inert gas plasma in the step of decomposing the precursor.

Some embodiments provide a method for forming a single-phase multi-element film on a substrate in a reaction zone by plasma enhanced atomic layer deposition (PEALD) repeating a single deposition cycle, said single deposition cycle comprising: (a) supplying a precursor gas over the substrate while supplying no reactant gas and applying no RF power; (b) purging the reaction zone; (c) supplying an inert gas over the substrate while supplying no precursor gas or no reactant gas and applying RF power; (d) supplying a reactant gas over the substrate while supplying no precursor gas and applying RF power; and (e) purging the reaction zone, wherein the multi-element film contains silicon and at least two other elements constituting a matrix of the film, the precursor gas contains silicon and optionally at least one element to be incorporated in the matrix, and the reactant gas contains at least one element to be incorporated in the matrix and reacts with the precursor gas when RF power is applied.

In some embodiments, the precursor gas is comprised of one or more gases supplied to the reaction zone in a single pulse as a whole in the single deposition cycle. In some embodiments, the reactant gas is comprised of one or more gases supplied to the reaction zone in a single pulse as a whole in the single deposition cycle. In some embodiments, the reactant gas is comprised of two or more gases supplied separately in sequence to the reaction zone each in a single pulse in the single deposition cycle. In some embodiments, the inert gas is continuously supplied to the reaction zone during the single deposition cycle. In some embodiments, the purging of the reaction zone is effected using the inert gas continuously supplied to the reaction zone. In some embodiments, RF power is applied in a single continuous pulse during the step of supplying the inert gas and the step of supplying the reactant gas.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

In this disclosure, the term "single-phase" film refers to a film formed by repeating a single deposition cycle as opposed to a laminate film formed by repeating different deposition cycles. The term "dilution gas" refers to a gas generating a plasma when RF power is applied, which plasma decomposes a precursor adsorbed on a surface of a substrate but does not typically incorporate the element(s) of the dilution gas into the matrix of a resultant layer formed on the substrate. The dilution gas is constituted by a rare gas or other inert gas and may serve as a purge gas. The "reactant gas" refers to a gas generating a plasma when RF power is applied, which plasma reacts with a precursor adsorbed on a surface of a substrate and incorporates an element of the reactant gas into the matrix of a resultant layer formed on the substrate. The reactant gas is typically constituted by at least one non-metal element. The term "precursor" refers to a material containing silicon and optionally at least one non-metal element to be incorporated in the matrix of a resultant layer formed on a substrate.

In this disclosure, "gas" may include vaporized solid and/or liquid and may be constituted by a mixture of gases. Likewise, "a" refers to a species or a genus including multiple species. In this disclosure, the reactant gas, the dilution gas, and the precursor may be different from each other or mutually exclusive in terms of gas types; i.e., there is no overlap of gas types among these categories. Further, in this disclosure, any two numbers of a variable can constitute an applicable range of the variable, and any ranges indicated may include or exclude the endpoints. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers.

In the present disclosure where conditions and/or structures are not specified, the skilled artisan in the art can readily provide such conditions and/or structures, in view of the present disclosure, as a matter of routine experimentation. Also, in the present disclosure including the examples described later, the numbers applied in specific embodiments can be modified by a range of at least ±50% in some embodiments, and the ranges applied in some embodiments may include or exclude the lower and/or upper endpoints. Further, the numbers include approximate numbers, and may refer to average, median, representative, majority, etc. in some embodiments. In the disclosure, "substantially the same", "substantially uniform", or the like may refer to an immaterial difference or a difference recognized by a skilled artisan such as those of less than 10%, less than 5%, less than 1%, or any ranges thereof in some embodiments.

In this disclosure, any defined meanings do not necessarily exclude ordinary and customary meanings in some embodiments.

Figure 4:
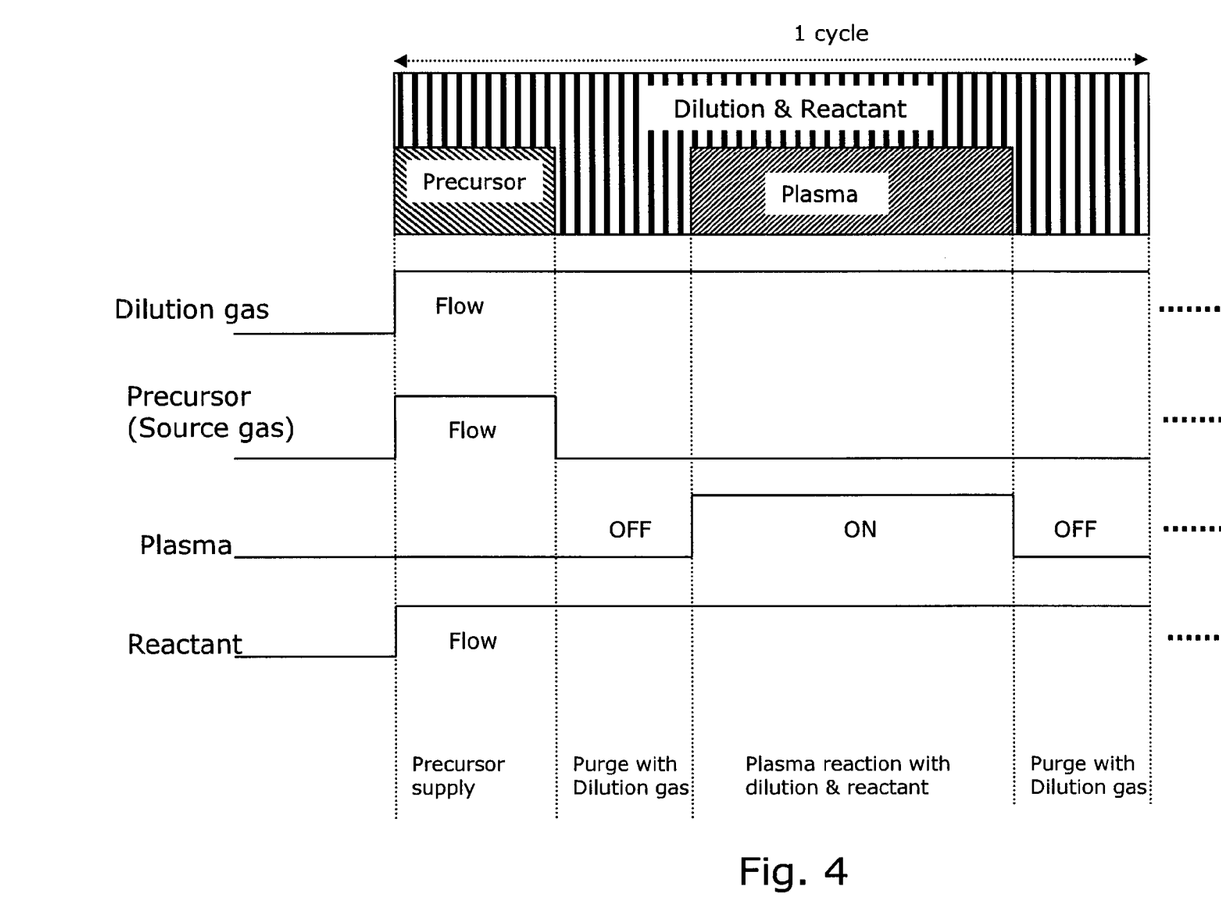
FIG. 4 illustrates a sequence for one cycle for depositing a multi-element film by PEALD according to a comparative method. The sequence does not represent actual time length of each step.

As discussed above, one object of the present invention is to provide a method of depositing a multi-element film by ALD without using laminating different sub-layers. One candidate for depositing a multi-element Si-based insulation film using a single type of cycle, i.e., without laminating different sub-layers, is as follows: A precursor and a reactant are selected so as to obtain a target multi-element Si-based film expressed as $Si(X, Y)$ ($X, Y=B, C, N,$ or $O$), and the precursor is decomposed and subjected to plasma surface reaction with a reactant. FIG. 4 illustrates such a sequence for one cycle for depositing a multi-element film by PEALD. The sequence does not represent actual time length of each step. In this figure, a dilution gas such as Ar and a reactant gas such as $O_2$ are continuously supplied to a reaction zone in which a substrate is placed, and a cycle constituted by a step of supplying a precursor in a pulse, a step of purging the reaction zone, a step of applying RF power in a pulse for plasma reaction, and a step of purging the reaction zone is repeated to form the target multi-element Si-based film on the substrate. However, the reactant gas such as $O_2$ is highly reactive, and even when the amount of the reactant gas is small, plasma surface reaction such as oxidation progresses, and as a result, the composition of the resultant film tends to be shifted to SiO, for example, rather than forming SiOC, for example.

Figure 2:
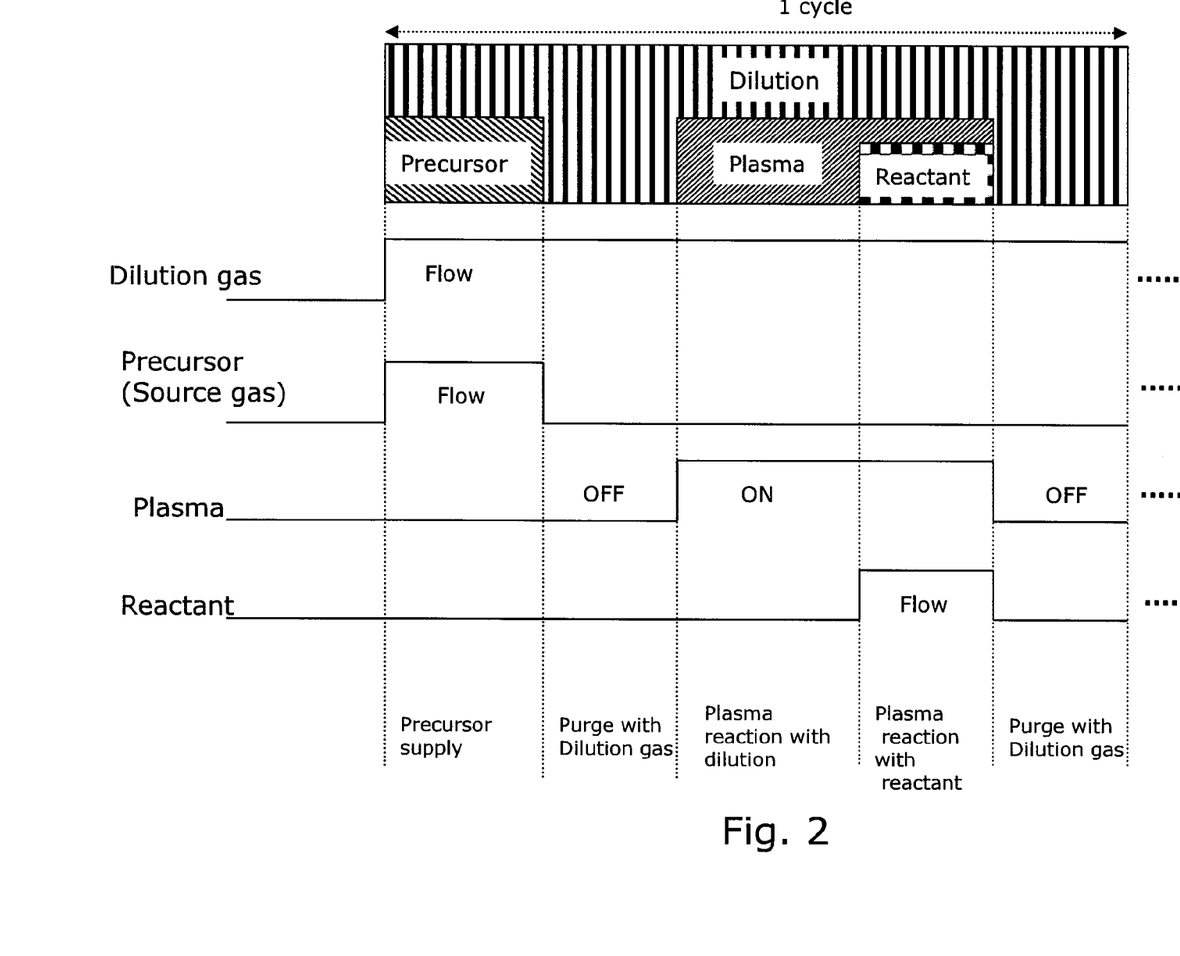
FIG. 2 illustrates a sequence for one cycle for depositing a multi-element film by PEALD according to an embodiment of the present invention. The sequence does not represent actual time length of each step.

In some embodiments of the present invention, the reactant gas is not supplied continuously, and the reaction zone is basically kept in an inert gas environment established by continuously supplying an inert gas such as Ar, He, and/or $N_2$, and the step of applying RF power in a pulse is divided into multiple steps. After a step of supplying a precursor in a pulse and a step of purging the reaction zone, RF power is applied to the reaction zone kept in an environment without a reactant, thereby decomposing the precursor with an inert gas plasma and densifying decomposed precursor on the surface of the substrate. Next, the reactant gas is supplied to the reaction zone while applying the RF power, thereby generating a plasma of the reactant such as an oxygen plasma so as to incorporate the element of the reactant gas such as oxygen into a layer depositing on the substrate. As such, the step of applying the RF power is divided into multiple steps, wherein a later step is conducted in an environment different from that used in an earlier step. After the step of applying the RF power, a step of purging the reaction zone is conducted. The above steps constitute one cycle and are repeated to form a target multi-element Si-based film on the substrate. FIG. 2 illustrates the above sequence for one cycle for depositing a multi-element film by PEALD according to an embodiment of the present invention. The sequence does not represent actual time length of each step. In some embodiments, the dilution gas is supplied in a pulse for purging the reaction zone, and for generating a dilution gas plasma, instead of continuously supplying the dilution gas throughout the cycle.

In FIG. 2, by shortening the pulse of the reactant gas such as $O_2$, decreasing the flow amount, and controlling the proper amount of the reactant gas, the reactivity of the reactant gas can be diminished, thereby enabling selective deposition of SiO(X) (X=B, C, N, etc.), the composition of which is determined according to the compositions of the precursor and reactant without shifting to SiO. Likewise, for any suitable reactant gas or reactant gases, by applying an inert gas plasma first without a reactant gas or gases, and controlling the amount of the reactant gas or gases, a multi-element Si-based insulation film expressed as, for example, Si(X, Y, Z) (X, Y, Z=B, C, N, O, etc.) can selectively be obtained.

In the above, since the RF power is first applied to the reaction zone kept in an inert gas environment without a reactant gas to decompose the precursor and densify the decomposed components on the substrate surface, and as the inert gas, Ar, He, and/or $N_2$ are/is used, damage to the substrate or photoresist which is an underlying material vulnerable to plasma damage can be inhibited.

Figure 3:
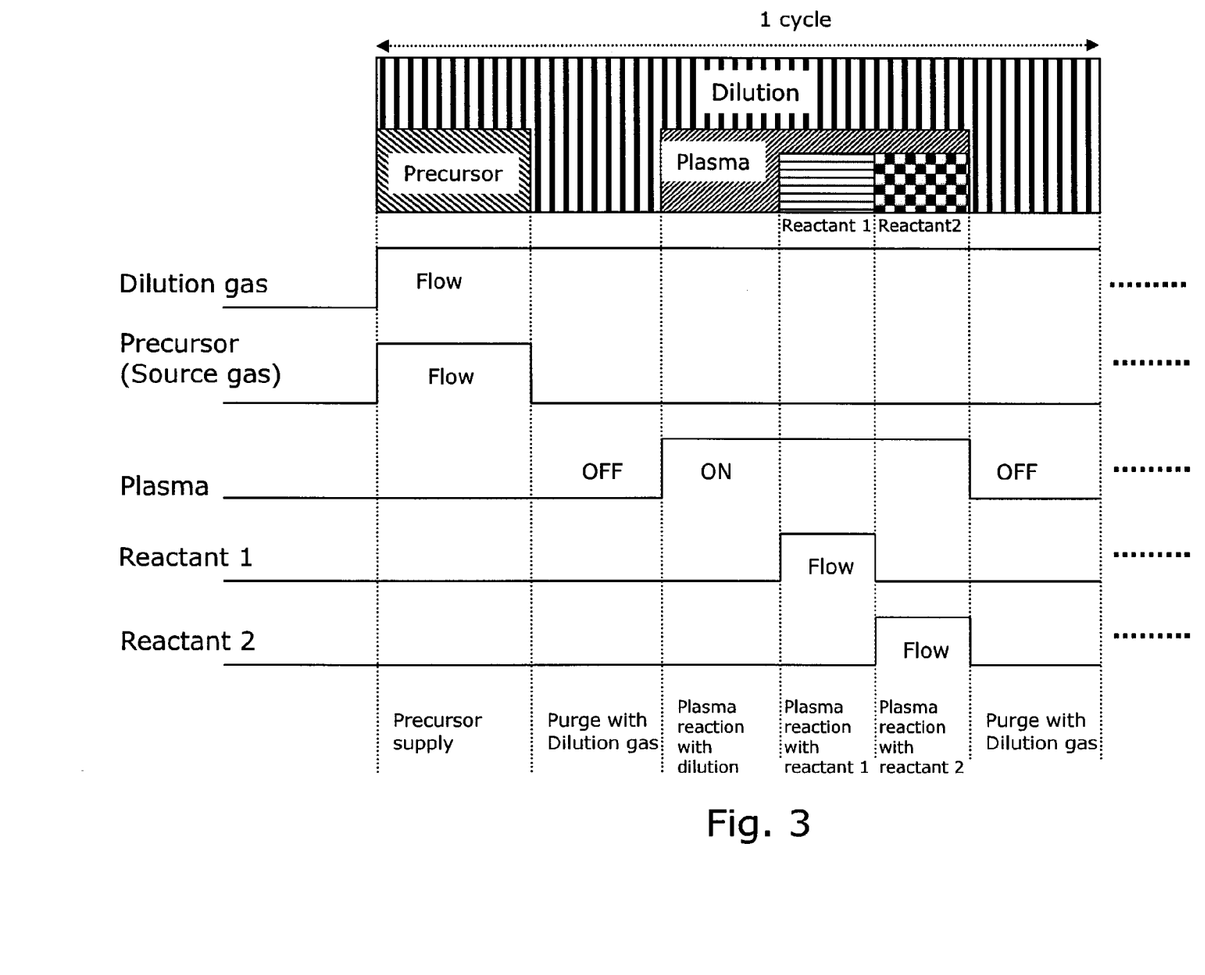
FIG. 3 illustrates a sequence for one cycle for depositing a multi-element film by PEALD according to another embodiment of the present invention. The sequence does not represent actual time length of each step.

FIG. 3 illustrates a sequence for one cycle for depositing a multi-element film by PEALD according to another embodiment of the present invention. The sequence does not represent actual time length of each step. In this embodiment, two reactant gases are used (Reactant 1 and Reactant 2). The step different from that illustrated in FIG. 2 is a later step of applying RF power, which is divided into two steps in FIG. 3, corresponding to Reactant 1 and Reactant 2, respectively. In some embodiments, a pulse of Reactant 1 and a pulse of Reactant 2 do not overlap and are continuous. In some embodiments, a pulse of Reactant 1 and a pulse of Reactant 2 overlap and are continuous. In some embodiments, a pulse of Reactant 1 and a pulse of Reactant 2 do not overlap and are separated by purging. While each reactant gas is supplied to the reaction zone, RF power is applied. The number of reactant gasses can be more than two in some embodiments depending on the target composition of the film and the type of precursor.

In some embodiments, since a single type of cycle is used to form a multi-element film such as SiOX film by ALD, the multi-element film is considered to be a single-phase film, as compared with a laminate film formed using different types of cycle such as a cycle for SiO and a cycle for SiC to form a SiOC film. As compared with the laminate film, the single-phase film is highly uniform in composition, and especially uniformity of film composition in a depth direction is excellent.

The amount of each element such as B, C, N, and/or O in the multi-element film varies depending on the type of precursor. As the precursor, any suitable silicon-containing compounds can be used, and by selecting the type of precursor, the content of B, C, N, and/or O derived from the precursor and incorporated into the film can be controlled, thereby controlling the composition of the resultant film.

In some embodiments, the multi-element film is expressed as $SiX_{(n)}$ wherein n is an integer of 2 to 4, and each of $X_{(n)}$ is differently one element selected from B, C, N, and O. In some embodiments, the multi-element film may be any suitable film containing silicon and at least two non-metal elements, which includes, but is not limited to, films selected from the group consisting of SiOC, SiOCN, SiCN, SiBN, and SiCOB.

In some embodiments, the Si-containing precursor may comprise Si, N, H, and optionally C in its molecule. In some embodiments, the Si-containing precursor may have a formula of $Si\alpha H\beta X\gamma$, wherein $\alpha$ and $\beta$ are integers and $\gamma$ is an integer including zero, X is N and/or $C_mH_n$ wherein m and n are integers. In some embodiments, $\alpha$ may be 1 to 5, $\beta$ may be 1 to 10, and $\gamma$ may be 0 to 6. In some embodiments, m may be 2 to 18, and n may be 6 to 30. In some embodiments, the Si-containing precursor may be vapor or liquid at room temperature. In some embodiments, the silicon-containing precursor may be one or more precursors. In some embodiments, the precursor may include aminosilane selected from the group consisting of BDEAS (bis(diethylamino)silane), BEMAS (bis(ethylmethylamino)silane), 3DMAS (trisdimethylaminosilane), and HEAD (hexakisethylaminosilane). In some embodiments, the silicon-containing precursor may include alkylsilane such as disilabutane, or chlorosilane such as dichlorotetramethyldisilane. Some precursors may provide Si and optionally at least one non-metal element. Some precursors provide Si, C, and N, and some precursors provide Si and C, or Si and N.

The reactant gas contains at least one element to be incorporated in the matrix and reacts with the precursor gas when RF power is applied. Typically, the reactant gas contains only non-metal elements. In some embodiments, the reactant gas contains a metal element. In some embodiments, the reactant gas may be any suitable gas or gases including, but not limited to, gas supplying oxygen such as $O_2$, $CO_2$, and/or $N_2O$, gas supplying nitrogen such as $NH_3$ and/or $N_2$, gas supplying boron such as TEB (triethylborane), and/or gas supplying carbon such as $CH_4$ or other hydrocarbon. The dilution gas may be one or more rare gases such as Ar, He, Kr, and/or Xe, and/or other inert gas such as $N_2$.

A combination of precursor and reactant gas is selected depending on the composition of the target multi-element film. For example, such a combination is as follows:

TABLE 1

| Film | RI | Precursor | Reactant 1 | Reactant 2 | Dilution |
|---|---|---|---|---|---|
| SiOC(N) | 1.45-1.6 | Aminosilane | $O_2$ | — | He/Ar/$N_2$ |
| | 1.6 | Aminosilane | $CO_2$ | — | He/Ar/$N_2$ |
| | 1.7 | Aminosilane | $N_2O$ | — | He/Ar/$N_2$ |
| | 2.0-2.2 | Aminosilane | $NH_3$ | $O_2$ | He/Ar |
| | 1.6-1.8 | Aminosilane | $NH_3$ | $O_2$ | He/Ar |
| | 1.6-1.8 | Aminosilane | $N_2$ | $O_2$ | He/Ar |
| SiCO | ?? | Chlorosilane | $O_2$ | — | He/Ar/$N_2$ |
| SiCN | 1.8-2.0 | Alkylsilane/ Aminosilane | $N_2$ | — | He/Ar |
| | | Alkylsilane/ Aminosilane | $NH_3$ | — | He/Ar |
| | | Alkylsilane/ Aminosilane | $CH_4$ | $N_2$/$NH_3$ | He/Ar |
| SiBN | 1.8-2.0 | Alkylsilane/ Aminosilane/ Chlorosilane | TEB | $NH_3$ | He/Ar |
| | | Alkylsilane/ Aminosilane/ Chlorosilane | TEB | — | He/Ar/$N_2$ |
| SiCOB | 1.6-1.8 | Alkylsilane/ Chlorosilane | TEB | $O_2$ | He/Ar/$N_2$ |

In the above, when more than one reactant gas is used, in some embodiments, a reactant gas which is less reactive is supplied first, and a reactant gas which is more reactive is supplied later as shown in Table 1 (Reactant 1 is less reactive than Reactant 2), thereby more effectively diminishing or controlling the reactivity of the more reactive reactant gas. In some embodiments, the supply order is reversed. In some embodiments, a reactant gas is added to the reaction zone while maintaining dilution gas flow, i.e., a reactant gas plasma is added to an inert gas plasma wherein the reactivity of the reactant gas is enhanced by the inert gas plasma.

In the above, the value of RI (refractive index at 633 nm) is indicative of the composition of the film. For example, a SiO film has an RI of 1.45, and when the film contains other elements such as C, N, B, and/or O, the RI is expected to be changed. Thus, by using RI, it can be determined whether the film is multi-elemental.

In some embodiments, the following conditions may be used:

1) The duration of one cycle: about 1.4 seconds to about 6.0 seconds, typically about 1.4 seconds to about 3.5 seconds for the use of a single reactant gas, typically about 3.0 seconds to about 6.0 seconds for the use of two reactant gases.

2) The duration of precursor pulse: about 0.5 seconds to about 10 seconds, typically about 0.5 seconds to about 1.5 seconds.

3) The duration of purging after 2): about 0.2 seconds to about 10 seconds, typically about 0.2 seconds to about 1.0 seconds. In some embodiments, the duration of purging is shorter than that of precursor pulse.

4) The duration of dilution gas plasma (application of RF power to dilution gas): about 0.5 seconds to about 10 seconds, typically about 0.5 seconds to about 1.5 seconds.

5) The duration of reactant gas plasma in total (application of RF power to each reactant gas): about 0.1 seconds to about 10 seconds, typically about 0.1 seconds to about 1.0 seconds. For example, if the total duration is 10 using two reactant gases, when the duration of reactant 1 pulse is 9, the duration of reactant 2 pulse is 1. In some embodiments, the duration of reactant 2 pulse is less than the duration of reactant 1 pulse, typically when the reactivity of reactant 2 is higher than that of reactant 1. In some embodiments, the duration of reactant 1 pulse is less than the duration of reactant 2 pulse. In some embodiments, the duration of reactant gas plasma is shorter than that of dilution gas plasma (in some embodiments, less than 50%).

6) The duration of purging after 5): about 0.2 seconds to about 10 seconds, typically about 0.2 seconds to about 1.0 seconds. In some embodiments, the duration of purging is the same as 3).

7) The flow rate of precursor (including carrier gas which carries precursor vapor from a vaporization tank): about 1,000 sccm to about 5,000 sccm, typically about 1,000 sccm to about 2,000 sccm.

8) The flow rate of dilution gas: about 500 sccm to about 5,000 sccm, typically about 500 sccm to about 2,000 sccm.

9) The flow rate of each reactant gas: about 30 sccm to about 50 sccm.

10) The pressure in the reaction zone for deposition: about 200 Pa to about 450 Pa, typically about 200 Pa to about 250 Pa.

11) The temperature of the reaction zone for deposition: about 50° C. to about 200° C., typically about 50° C. to about 100° C.

12) The RF power for generating a plasma: about 0.04 $W/cm^2$ to about 0.40 $W/cm^2$ per area of the substrate, typically about 0.04 $W/cm^2$ to about 0.10 $W/cm^2$.

13) The frequency of RF power: 13.56 MHz or 27 MHz, typically 13.56 MHz. Typically, a single frequency is used; in some embodiments; the high RF frequency power may be used in combination with low RF power of 5 MHz or less (which is less than 50%).

14) The resultant multi-element film thickness: about 3 nm to about 25 nm, typically about 3 nm to about 10 nm.

15) The number of cycles to obtain the multi-element film: about 200 to about 900, typically about 200 to about 700.

Figure 1:
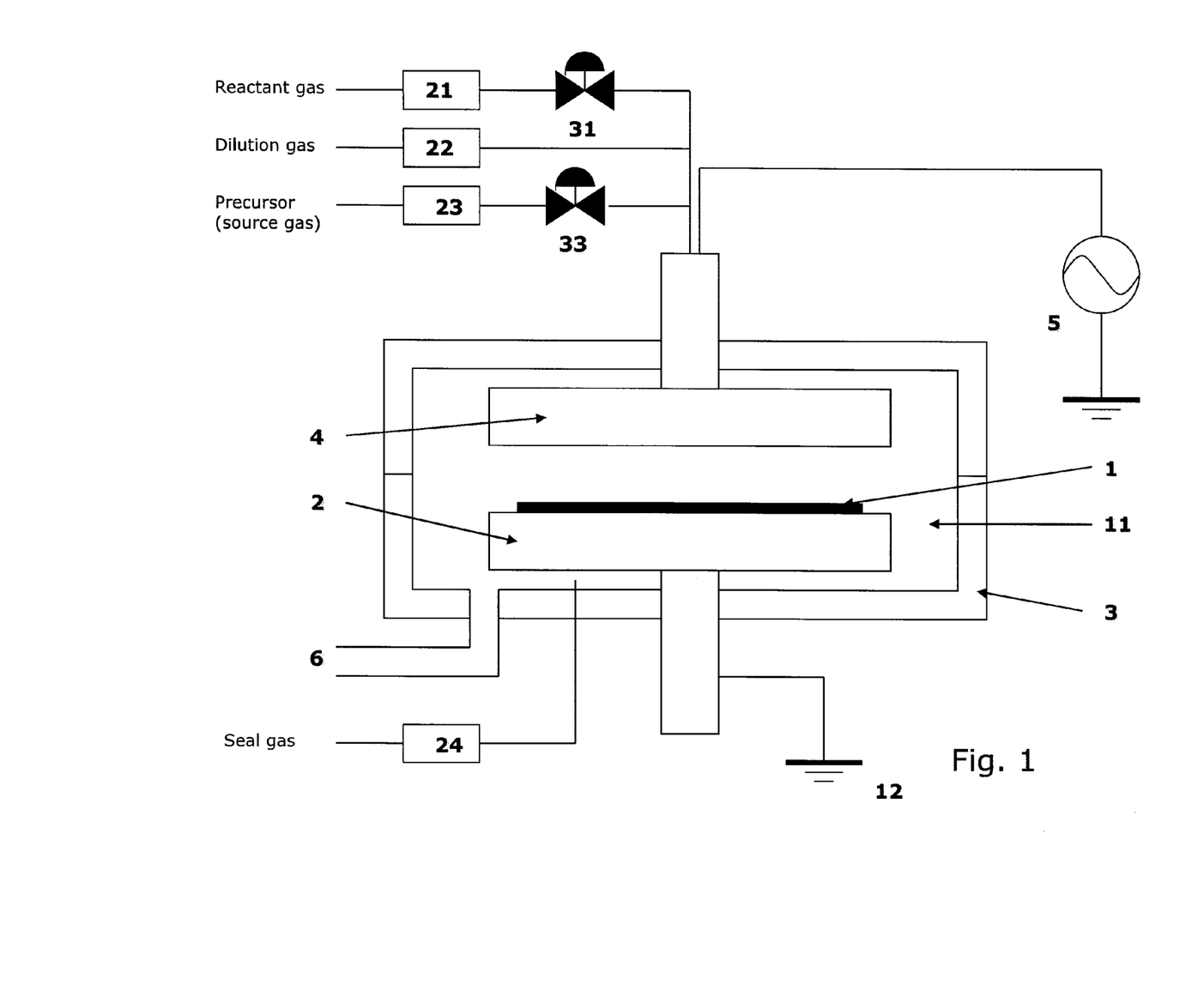
FIG. 1 is a schematic representation of a PEALD apparatus for depositing a multi-element film according to an embodiment of the present invention.

Embodiments are explained with reference to the drawings which are not intended to limit the present invention. FIG. 1 is a schematic representation of a PEALD apparatus for depositing a multi-element film according to an embodiment of the present invention.

In this example, by providing a pair of electrically conductive flat-plate electrodes 4, 2 in parallel and facing each other in the interior 11 of a reaction chamber 3, applying HRF power (13.56 MHz or 27 MHz) 5 (and as necessary LRF power of 5 MHz or less (400 kHz~500 kHz) not shown) to one side, and electrically grounding 12 the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and a precursor gas is introduced into the reaction chamber 3 through a gas flow controller 23, a pulse flow control valve 33, and the shower plate 4. A reactant gas is introduced also into the reaction chamber 3 through a gas flow controller 21, and a pulse flow control valve 31, and the shower plate 4. The use of the pulse flow control valve enables a pulse supply of the gas for ALD. A dilution gas is introduced continuously into the reaction chamber through a gas flow controller 22 and the shower plate 4. Additionally, in the reaction chamber 3, an exhaust pipe 6 is provided through which gas in the interior 11 of the reaction chamber 3 is exhausted. Additionally, the reaction chamber 3 is provide with a seal gas flow controller 24 to introduce a seal gas into the interior 11 of the reaction chamber 3 (a separation plate for separating a reaction zone and a transfer zone in the interior of the reaction chamber is omitted from this figure).

When two or more reaction gases are used, other gas lines similar to the line with the gas flow controller 21 and the pulse flow control valve 31 can be added.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics and gas flow controllers or valves of the reactor, as will be appreciated by the skilled artisan.

EXAMPLE 1

A dielectric multi-element SiOX film was formed on a 300-mm substrate under the conditions shown below using the sequence illustrated in FIG. 2 and the PEALD apparatus illustrated in FIG. 1. In this example, X was C and N.

The length of one cycle: 3.1 sec to 4.1 sec
Precursor: BDEAS: 500 sccm to 1,000 sccm
Dilution gas: He: 2000 sccm
Reactant gas: $O_2$: 30 sccm
Seal gas: He: 500 sccm
Substrate temperature: 100° C.
Pressure: 230 Pa
High frequency RF power (a frequency of 13.56 MHz): 0.08 $W/cm^2$
Precursor supply pulse duration: 1.5 sec
Purge time: 0.3 sec
The total duration of dilution gas plasma and reactant gas plasma: 1.0 sec
The number of cycles: 600 times
The thickness of the film: 10 nm to 20 nm The duration of reactant gas plasma was changed from 0 sec to 1.0 sec while maintaining the total duration of dilution gas plasma and reactant gas plasma, 1.0 sec. The refractive index at 633 nm of each resultant film was measured. The result is shown in the table below.

TABLE 2

| Plasma Total | O2 Plasma | RI @ 633 nm | Remarks |
|---|---|---|---|
| 1.0 sec | 0.0 sec | 1.93 | Si(O)X; substantially free of oxygen |
|  | 0.1 sec | 1.54 | SiOX |
|  | 0.2 sec | 1.50 | SiOX |
|  | 0.4 sec | 1.49 | SiOX |
|  | 1.0 sec | 1.45 | SiO; substantially similar to RI of conformal SiO |

As shown in Table 2, depending on the duration of the reactant gas plasma, the composition of the film varied from SiO to SiCN. Since oxygen has high reactivity, even when the duration of oxygen plasma was 10% of the total plasma duration, a sufficient amount of oxygen appeared to have been incorporated into the film. Typically, the duration of a reactant gas plasma may be less than 50%, 30%, 20%, or even less than 10%, but more than 0% of the total plasma duration.

EXAMPLE 2

A dielectric multi-element SiCON film was formed on a 300-mm substrate under the conditions shown below using the sequence illustrated in FIG. 2 and the PEALD apparatus illustrated in FIG. 1.

The length of one cycle: 2.5 sec
Precursor: BDEAS: 500 sccm
Dilution gas: Ar, He: 1000 sccm
Reactant gas: $O_2$: 40 sccm at maximum
Seal gas: He: 500 sccm
Substrate temperature: 50° C.
Pressure: 200 to 300 Pa
High frequency RF power (a frequency of 13.56 MHz): 0.07 W/cm$^2$
Precursor supply pulse duration: 0.5 sec
Purge time: 0.3 sec
The duration of dilution gas plasma: 1.0 sec
The duration of reactant gas plasma: 0.4 sec at maximum
The number of cycles: 100 times
The thickness of the film: 10 nm After the target multi-element SiCON film was obtained, the composition of the resultant film was analyzed by XPS (Narrow Scan Overlay), and the result is shown in the table below. Since the film was thin, the composition was analyzed by using different scanning angles (45° and 90°) wherein the energy can penetrate the film to a greater depth at a scanning angle of 90° (approximately 7 to 8 nm) than at a scanning angle of 45° (approximately 4 to 5 nm) so that the compositions at different depths could be determined. As shown in the table, the compositions at different depths appear to be substantially similar to each other, revealing that the composition of the film was uniform in the depth direction.

TABLE 3

|  |  | Composition [Atomic %] | | | |
|---|---|---|---|---|---|
| Angle | Depth | Si | O | C | N |
| 45° | 4 to 5 nm | 12.2 | 24.1 | 54.9 | 8.9 |
| 90° | 7 to 8 nm | 15.8 | 24.1 | 52.2 | 7.8 |

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for forming a single-phase multi-element film on a substrate in a reaction zone by plasma enhanced atomic layer deposition (PEALD) repeating a single deposition cycle, said single deposition cycle comprising:
    adsorbing a precursor on the substrate in the absence of reactant and plasma;
    decomposing the precursor adsorbed on the substrate by an inert gas plasma; and
    reacting the decomposed precursor with a reactant gas plasma in the presence of the inert gas plasma,
    wherein the multi-element film contains silicon and at least two non-metal elements constituting a matrix of the film, the precursor contains silicon and optionally at least one non-metal element to be incorporated in the matrix, and the reactant gas contains at least one non-metal element to be incorporated in the matrix,
    wherein an inert gas is supplied continuously throughout the single deposition cycle, serves as a purge gas between the step of adsorbing the precursor and the step of decomposing the precursor, and after the step of reacting the decomposed precursor, and is used for generating the inert gas plasma in the step of decomposing the precursor.

2. The method according to claim 1, wherein the step of decomposing the precursor and the step of reacting the decomposed precursor are conducted continuously in sequence.

3. A method for forming a single-phase multi-element film on a substrate in a reaction zone by plasma enhanced atomic layer deposition (PEALD) repeating a single deposition cycle, said single deposition cycle comprising:
    adsorbing a precursor on the substrate in the absence of reactant and plasma;
    decomposing the precursor adsorbed on the substrate by an inert gas plasma; and
    reacting the decomposed precursor with a reactant gas plasma in the presence of the inert gas plasma,
    wherein the multi-element film contains silicon and at least two non-metal elements constituting a matrix of the film, the precursor contains silicon and optionally at least one non-metal element to be incorporated in the matrix, and the reactant gas contains at least one non-metal element to be incorporated in the matrix,
    wherein the step of decomposing the precursor and the step of reacting the decomposed precursor are conducted continuously in sequence, and
    wherein the duration of the step of reacting the decomposed precursor is less than 50% of the total duration of the step of decomposing the precursor and the step of reacting the decomposed precursor.

4. The method according to claim 3, wherein the total duration of the step of decomposing the precursor and the step of reacting the decomposed precursor is about 0.6 seconds to about 2.5 seconds.

5. The method according to claim 3, wherein the step of reacting the decomposed precursor comprises supplying a reactant gas at a flow rate of about 50 sccm or less to the reaction zone while applying RF power to the reaction zone.

6. The method according to claim 3, wherein an inert gas is supplied continuously throughout the single deposition cycle, serves as a purge gas between the step of adsorbing the precursor and the step of decomposing the precursor, and after the step of reacting the decomposed precursor, and is used for generating the inert gas plasma in the step of decomposing the precursor.

7. The method according to claim 1, wherein the single deposition cycle is repeated about 300 times to about 900 times.

8. The method according to claim 1, wherein the multi-element film is expressed as $SiX_{(n)}$ wherein $X_{(n)}$ represents n different non-metal elements and n is an integer of 2 to 4, and each of $X_{(n)}$ is selected from B, C, N, and O.

9. The method according to claim 5, wherein the reactant gas is one or more gases selected from the group consisting of $O_2$, $CO_2$, $N_2O$, $NH_3$, $N_2$, $CH_4$, and TEB (triethylborane).

10. The method according to claim 1, wherein the precursor is one or more gases selected from the group consisting of alkylsilane, aminosilane, and chiorosilane.

11. The method according to claim 1, wherein the inert gas is one or more gases selected from the group consisting of He, Ar, and $N_2$.

12. The method according to claim 7, wherein the multi-element film has a substantially uniform composition along a thickness direction.

13. A method for forming a single-phase multi-element film on a substrate in a reaction zone by plasma enhanced atomic layer deposition (PEALD) repeating a single deposition cycle, said single deposition cycle comprising:
supplying a precursor gas over the substrate while supplying no reactant gas and applying no RF power;
purging the reaction zone;
supplying an inert gas over the substrate while supplying no precursor gas or no reactant gas and applying RF power;
supplying a reactant gas over the substrate while supplying no precursor gas and applying RF power; and
purging the reaction zone,
wherein the multi-element film contains silicon and at least two other elements constituting a matrix of the film, the precursor gas contains silicon and optionally at least one element to be incorporated in the matrix, and the reactant gas contains at least one element to be incorporated in the matrix and reacts with the precursor gas when RF power is applied.

14. The method according to claim 13, wherein the precursor gas is comprised of one or more gases supplied to the reaction zone in a single pulse as a whole in the single deposition cycle.

15. The method according to claim 13, wherein the reactant gas is comprised of one or more gases supplied to the reaction zone in a single pulse as a whole in the single deposition cycle.

16. The method according to claim 13, wherein the reactant gas is comprised of two or more gases supplied separately in sequence to the reaction zone each in a single pulse in the single deposition cycle.

17. The method according to claim 13, wherein the inert gas is continuously supplied to the reaction zone during the single deposition cycle.

18. The method according to claim 17, wherein the purging of the reaction zone is effected using the inert gas continuously supplied to the reaction zone.

19. The method according to claim 13, wherein the duration of the RF power application when supplying the reactant gas is shorter than the duration of the RF power application when supplying the inert gas.

20. The method according to claim 13, wherein RF power is applied in a single continuous pulse during the step of supplying the inert gas and the step of supplying the reactant gas.

* * * * *